US007619289B2

(12) United States Patent
Kim et al.

(10) Patent No.: US 7,619,289 B2
(45) Date of Patent: Nov. 17, 2009

(54) MEMS SWITCH AND METHOD FOR MANUFACTURING THE SAME

(75) Inventors: Jong-seok Kim, Hwanseong-si (KR); In-sang Song, Seoul (KR); Sang-hun Lee, Seoul (KR); Sang-wook Kwon, Seongnam-si (KR); Duck-hwan Kim, Goyang-si (KR); Yun-kwon Park, Dongducheon-si (KR); Hee-moon Jeong, Yongin-si (KR); Young-tack Hong, Suwon-si (KR); Che-heung Kim, Yongin-si (KR); Seok-chul Yun, Suwon-si (KR); Kuang-woo Nam, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 479 days.

(21) Appl. No.: 11/472,312

(22) Filed: Jun. 22, 2006

(65) Prior Publication Data

US 2007/0012654 A1 Jan. 18, 2007

(30) Foreign Application Priority Data

Jul. 18, 2005 (KR) ..................... 10-2005-0064798

(51) Int. Cl.
*H01L 29/78* (2006.01)

(52) U.S. Cl. ....................... 257/414; 257/181; 257/416; 310/343; 310/344

(58) Field of Classification Search ................. 257/414, 257/416, 181; 310/343, 344
See application file for complete search history.

(56) References Cited

U.S. PATENT DOCUMENTS

| | | | | |
|---|---|---|---|---|
| 7,038,355 | B2 * | 5/2006 | Bouche et al. | 310/324 |
| 2004/0157367 | A1 * | 8/2004 | Wong et al. | 438/106 |
| 2005/0146241 | A1 * | 7/2005 | Wan | 310/309 |

* cited by examiner

*Primary Examiner*—Kenneth A Parker
*Assistant Examiner*—Jose R Diaz
(74) *Attorney, Agent, or Firm*—Sughrue Mion, PLLC

(57) ABSTRACT

A MEMS switch includes a lower substrate having a signal line on an upper surface of the lower substrate; an upper substrate, having a cavity therein, disposed apart from the upper surface of the lower substrate by a distance, and having a membrane layer on a lower surface of the upper substrate; a bimetal layer formed in the cavity of the upper substrate on the membrane layer; a heating layer formed on a lower surface of the membrane layer; and a contact member formed on a lower surface of the heating layer. The contact member can come into contact with or separate from the signal line. A method for manufacturing the MEMS switch includes preparing the upper and lower substrates and combining them so that a surface having the signal line faces a surface having the contact member and the upper and lower substrates are disposed apart by a distance.

13 Claims, 10 Drawing Sheets

MEMS SWITCH AND METHOD FOR MANUFACTURING THE SAME

CROSS-REFERENCE TO RELATED APPLICATION

This application claims priority from Korean Patent Application No. 10-2005-0064798 filed on Jul. 18, 2005, the entire contents of which are incorporated herein by reference.

BACKGROUND OF THE INVENTION

1. Field of the Invention

Apparatuses and methods consistent with the present invention relate to a Micro-Electro-Mechanical Systems (MEMS) switch and a method for manufacturing the same.

2. Description of the Related Art

Electronic systems for use in a high frequency bandwidth are getting slimmer, smaller, lighter, and better in performance. Ultra-small microswitches using a new technology such as micromachining are being developed to substitute for semiconductor devices such as Field Effect Transistors (FET) and pin diodes, which have been used for controlling such electronic systems.

Among radio frequency (RF) devices using MEMS technologies, most devices manufactured are switches. RF switches are frequently applied in signal transmission circuits and impedance matching circuits for use in wireless terminals and systems using micro- or millimeter-wavelength bandwidth.

In conventional MEMS switches, electrification is caused when a DC voltage is applied to a fixed switch and thus a movable electrode is attracted to a substrate due to an electrostatic attraction. As the movable electrode is attracted to the substrate, a contact member provided on the movable electrode comes into contact with a signal line provided on the substrate. The switch operates so that the switch is turned on and off as the contact member comes into contact with and is separated from the signal line in response to the voltage application.

However, MEMS switches performing their switching operations by electrostatic attraction have disadvantages as discussed below.

First, such conventional MEMS switches operate at a high driving voltage.

Second, in manufacturing the MEMS switches on a wafer, structures constituting the MEMS switches are not the same over the entire area of the wafer, that is, the uniformity of the structures manufactured in the wafer is not good.

Third, since the manufacturing method of the MEMS switches includes lots of process steps, the MEMS switches are manufactured in low yield.

Here, "uniformity" means that distances between fixed electrodes and movable electrodes in lots of cells are constant all over the wafer.

Fourth, since a contact force of the contact member to the signal line is not stable, an insertion loss also increases as the number of switching operations increases.

SUMMARY OF THE INVENTION

An exemplary embodiment of the present invention provides a MEMS switch driven at a low voltage, having a stable contact force, and being capable of manufacture in a high yield, and a method for manufacturing the MEMS switch where the method is capable of enhancing a production yield by including a smaller number of process steps than conventional methods.

According to one exemplary embodiment of the present invention, there is provided an MEMS switch including a lower substrate having a signal line on an upper surface thereof; an upper substrate, having a cavity therein, being disposed apart from the upper surface of the lower substrate by a distance and having a membrane layer on a lower surface thereof; a bimetal layer formed in the cavity on the membrane layer; a heating layer formed on a lower surface of the membrane layer; and a contact member formed on a lower surface of the heating layer and coming into contact with or separating from a signal line.

The MEMS switch further includes a sealing layer disposed between the upper and lower substrates for maintaining the distance between the upper and lower substrates and for sealing an inner space between the upper and lower substrates.

The MEMS switch may further include a cover disposed over the upper substrate for covering the cavity.

The membrane layer may be made, for example, of an oxide material and the heating layer may be made, for example, of a polysilicon material.

The heating layer may have an electrical resistance heating body and the electrical resistance heating body may have, for example, a helical shape.

The electrical resistance heating body may further have a power supply unit for supplying a voltage. The power supply unit may include an upper voltage application pad connected to the resistance heating body, a lower voltage application pad formed on the upper surface of the lower substrate and connected to the upper voltage application pad, a voltage connection part buried in the lower substrate through a hole and connected to the lower voltage application pad, and an external voltage application pad formed on a lower surface of the lower substrate and connected to an external voltage application pad connected to the voltage connection part.

The MEMS switch may further include a signal line connection unit on the lower substrate for connecting the signal line to an external circuit. The signal line connection unit may include a signal line connection part buried in the lower substrate through a hole and connected to the signal line, and a signal line pad formed on the lower surface of the lower substrate and connected to the signal line connection part.

The upper and lower substrates may be made, for example, of a silicon material and the cover may be made, for example, of a glass material. The upper substrate and the cover may be joined, for example, by an anodic bonding method.

The signal line, contact member, and sealing layer may be made, for example, of a bondable conductive material and the conductive material may be one of Au, AuSn, and PbSn.

According to another embodiment of the present invention, there is provided a method for manufacturing an MEMS switch, including preparing a lower substrate by depositing a conductive layer and forming a signal line on a substrate by patterning the conductive layer; preparing an upper substrate by depositing a membrane layer on a lower surface of an upper substrate; depositing a heating layer on a lower surface of the membrane layer; forming a cavity by selectively etching the upper substrate; forming a bimetal on the membrane layer in the cavity; depositing a conductive layer on a lower surface of the heating layer and patterning the conductive layer to form a contact member; and combining the upper substrate and the lower substrate such that a surface having the signal line of the lower substrate faces a surface having the contact member of the upper substrate and the upper and the lower substrates are disposed apart by a distance.

The method further includes patterning the heating layer in a helical shape after the patterning the contact member.

A lower sealing layer for sealing the upper and lower substrates may be patterned while patterning the signal line, and an upper sealing layer for sealing the upper and lower substrates may be patterned while patterning the conductive layer to form a contact member.

The method further includes forming a signal line connection unit for connecting the signal line and the heating layer to an external circuit.

Forming the signal line connection unit may include: forming a plurality of holes to be extended to the signal line and the heating layer in the lower substrate before the forming the signal line; polishing the lower substrate after the upper and lower substrates are bonded to expose a surface of a conductive layer buried in the hole, where the conductive layer is formed for the signal line; and patterning an external voltage application pad and a signal line pad after depositing a conductive layer on the lower surface of the lower substrate.

The membrane layer may be made, for example, of an oxide material and the heating layer may be made, for example, of a polysilicon material.

The method further includes bonding a cover for covering the cavity to the upper surface of the upper substrate after the forming the bimetal layer.

The upper and lower substrates may be made, for example, of a silicon material and the cover may be made; for example, of a glass material.

The signal line, contact member, and sealing layer may be made, for example, of a bondable conductive material and the conductive material may be one of Au, AuSn, and PbSn.

BRIEF DESCRIPTION OF THE DRAWINGS

The above and other features of the present invention will be described in reference to certain exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the invention are shown.

Figure 1:
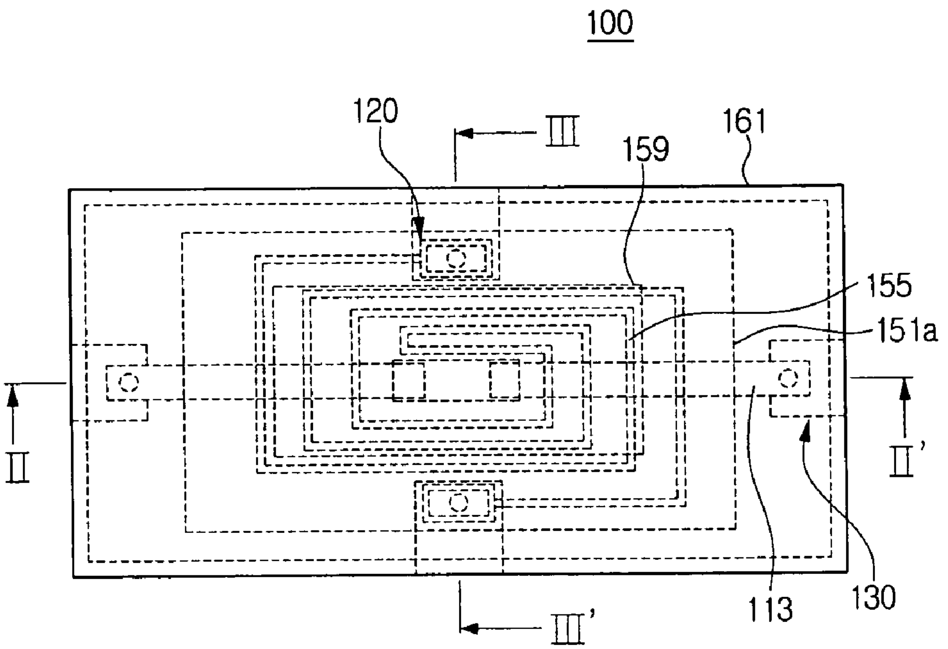
FIG. 1 is a layout view illustrating an MEMS switch according to an embodiment of the present invention.
Figure 2:
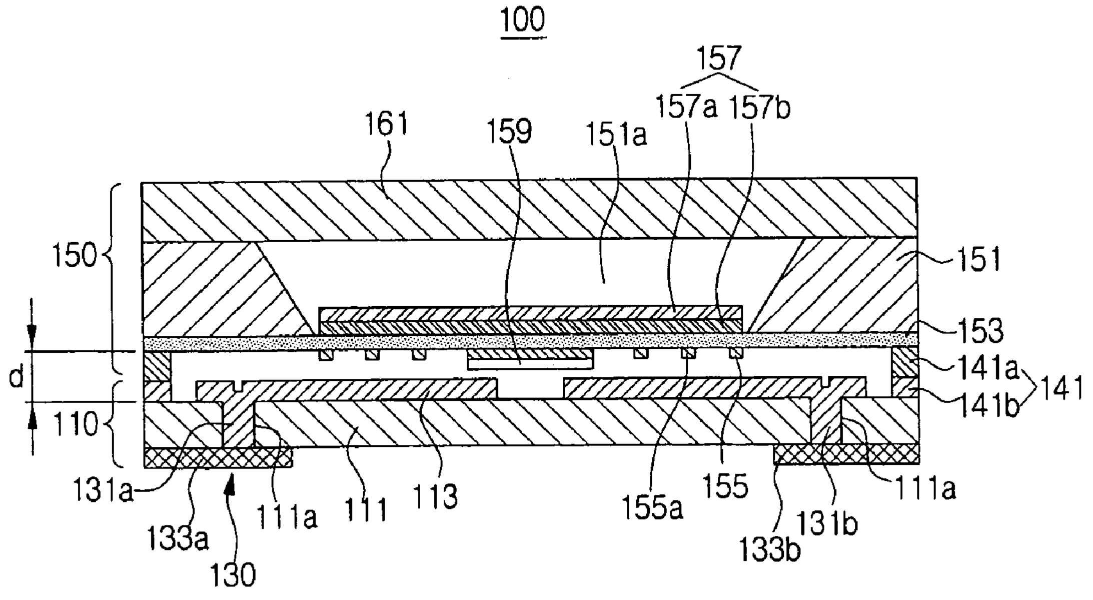
FIG. 2 is a sectional view taken along line II-II' of the MEMS switch shown in FIG. 1.
Figure 3:
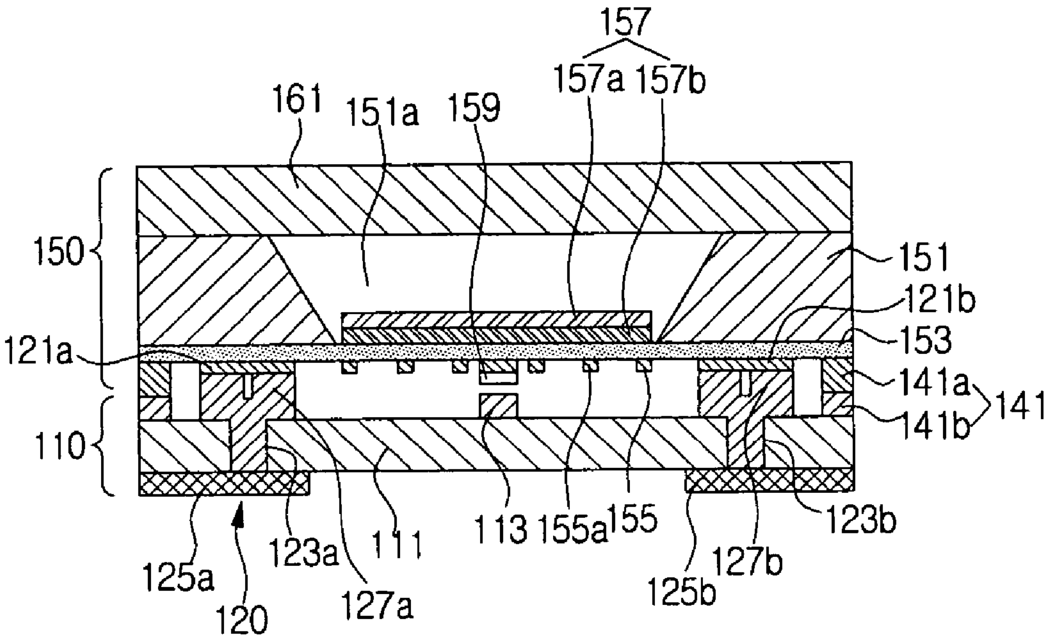
FIG. 3 is a sectional view taken along line III-III' of the MEMS switch shown in FIG. 1.

FIG. 1 illustrates a layout view of a MEMS switch according to one exemplary embodiment of the present invention, FIG. 2 illustrates a sectional view of the MEMS switch, where the view is taken along a line II-II' shown in FIG. 1, and FIG. 3 illustrates a sectional view of the MEMS switch where the view is taken along a line III-III' shown in FIG. 1.

Referring to FIGS. 1 to 3, the MEMS switch 100 includes a signal part 110 and a driving part 150.

The signal part 110 includes a lower substrate 111, a signal line 113 formed on an upper surface of the lower substrate 111, a signal line connection unit 130 for connecting external circuits, and a power supply unit 120 for supplying a voltage to a heating layer 155 in the driving part 150 to be described later. The lower substrate 111 may be made, for example, of a silicon material.

The driving part 150 includes an upper substrate 151 having a cavity 151*a* therein, a membrane layer 153 formed on a lower surface of the upper substrate 151, the heating layer 155 formed on a lower surface of the membrane layer 153, a bimetal layer 157 formed on an upper surface of the membrane layer 153, and a contact member 159 formed on a lower surface of the heating layer 155.

The upper substrate 151 may be made, for example, of a silicon material and the membrane layer 153 may be formed, for example, of an oxide material.

The heating layer 155 is an electrical resistance heating body 155*a* and may be formed, for example, of a polysilicon material. The heating layer 155 may be formed to have a coil shape and is movable by expansibility of the bimetal layer 157.

The contact member 159 is disposed on the lower surface of the heating layer 155, which is movable due to the expansibility of the bimetal layer 157 and serves to transfer RF signals when in contact with a signal line 113. The contact member 159 is made of a conductive material such as, for example, Au, AuSn, or PbSn.

The bimetal layer 157 is a switch formed of two different metal layers 157*a* and 157*b* joined together to form one unit having a differential expansion rating. The bimetal layer 157 will bend if there is a temperature change, that is, the metal layer 157*a* having a relatively high expansion rate bends toward the metal layer 157*b* having a relatively low expansion rate. The contact member 159 comes into contact with the signal line 113 due to this characteristic of the bimetal layer 157.

Figure 4:
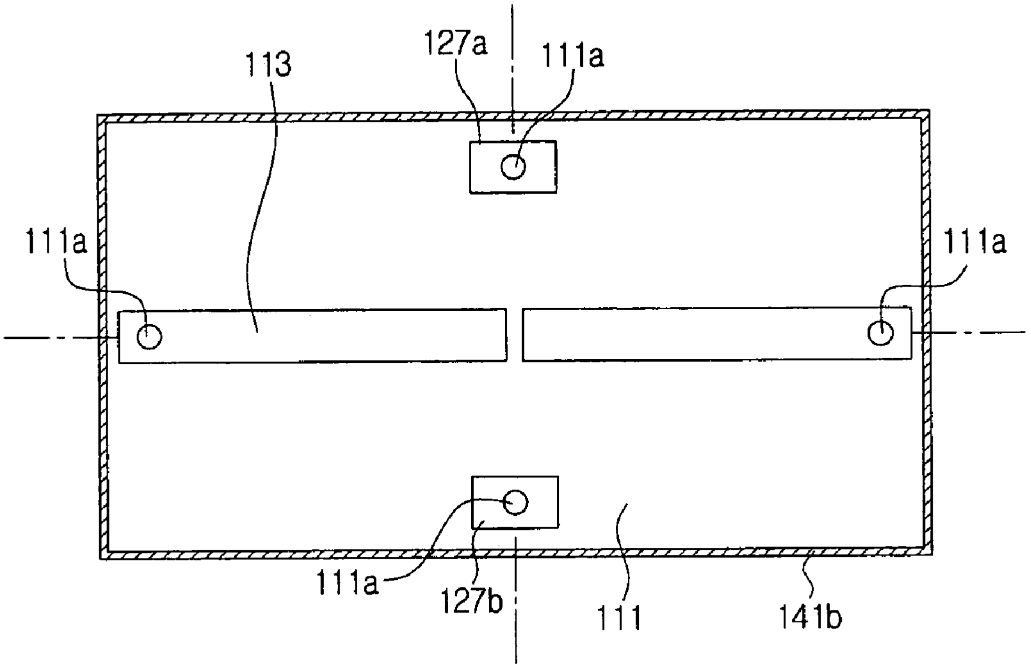
FIG. 4 is a top plan view illustrating a lower substrate of the MEMS switch shown in FIG. 1.
Figure 5:
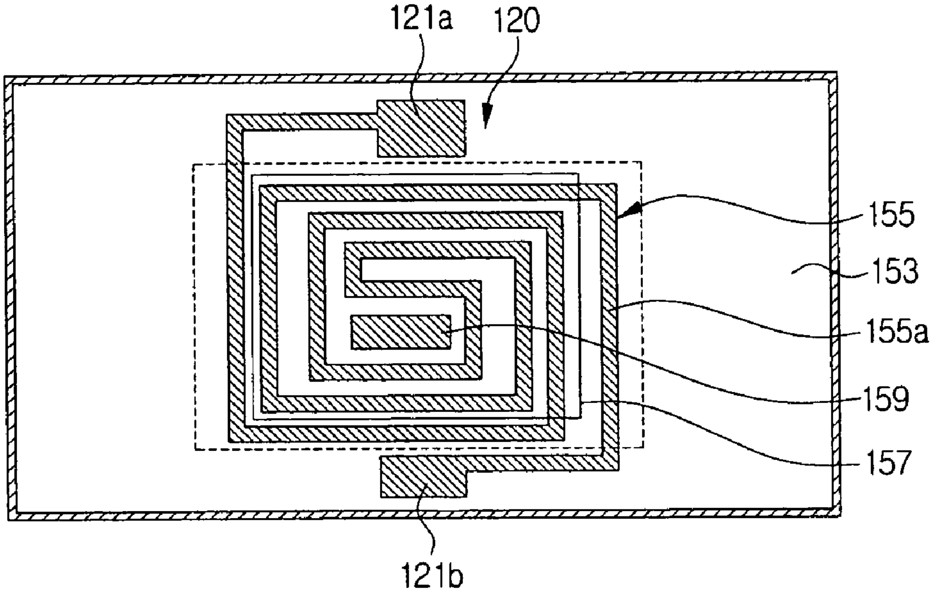
FIG. 5 is a bottom plan view illustrating an upper substrate of the MEMS switch shown in FIG. 1.

FIG. 4 illustrates a top plan view of the lower substrate of the MEMS switch shown in FIG. 1, and FIG. 5 illustrates a bottom plan view of the upper substrate of the MEMS switch shown in FIG. 1.

Referring to FIG. 3 and FIG. 5, there is provided the power supply unit 120 for supplying a voltage to the heating layer 155. The power supply unit 120 can include upper voltage application pads 121*a* and 121*b* connected to the electrical resistance heating body 155*a*, lower voltage application pads 127*a* and 127*b* formed on the upper surface of the lower substrate 111 and connected to the upper voltage application pads 121*a* and 121*b*, voltage connection parts 123*a* and 123*b* buried in the lower substrate 111, passing through holes 111*a* formed in the lower substrate 111 and connected to the lower voltage application pads 127*a* and 127*b* via the holes 111*a*, and external voltage application pads 125*a* and 125*b* formed on the lower surface of the lower substrate 111 and connected to the voltage connection parts 123*a* and 123*b*.

Referring to FIG. 2 and FIG. 4, there is provided the signal line connection unit 130 for connecting the MEMS switch to an external circuit. The signal line connection unit 130 is buried in the lower substrate 111 through the holes 111*a* and can include signal line connection parts 131*a* and 131*b* connected to the signal line 113, and signal line pads 133*a* and 133*b* formed on the lower surface of the lower substrate 111 and connected to the signal line connection parts 131*a* and 131*b*.

Referring to FIG. 2, a sealing layer 141 is provided between the upper substrate 151 and the lower substrate 111 to keep a distance between the upper substrate 151 and the lower substrate 111 and seal the inside space between the substrates 151 and 111.

The sealing layer 141 can be simultaneously patterned with the contact member 159 and the signal line 113. In this instance, the contact member 159 and the signal line 113 are made of the same material. Further, an upper sealing layer 141*a* formed on the upper substrate 151 and a lower sealing layer 141*b* formed on the lower substrate 111 are joined by a bonding method. Bondable conductive materials include, for example, Au, AuSn, and PbSn.

On the other hand, a cover 161 is provided on the upper surface of the upper substrate 151 to cover the cavity 151*a*. The cover 161 is formed of, for example, a glass material, and the upper substrate 151 and the cover 161 can be joined by an anodic bonding method.

In the MEMS switch having the structure described above, when a certain voltage is supplied to the MEMS switch through the external voltage application pads 125*a* and 125*b*, the voltage is supplied to the electrical resistance heating body 155*a* of the heating layer 155 through the voltage connection parts 123*a* and 123*b* and the upper and lower voltage application pads 121*a*, 121*b*, 127*a*, and 127*b*. Accordingly, the electrical resistance heating body 155*a* generates heat which is transferred to the bimetal layer 157. At this time, the bimetal layer 157 bends down due to the differential expansion rating of the metal layers 157*a* and 157*b*. In association with the bending of the bimetal layer 157, the membrane layer 153 and the heating layer 155 also bend down together so that the contact member 159 comes into contact with the signal line 113.

Hereinafter, a method for manufacturing an MEMS switch will be described.

Figure 6A:
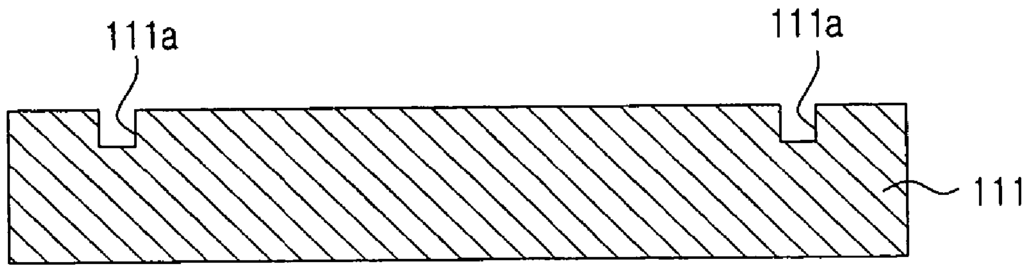
FIGS. 6A and 6B are sectional views illustrating process steps of forming the lower substrate shown in FIG. 2, where the views are taken along the line II-II' shown in FIG. 1.
Figure 6B:
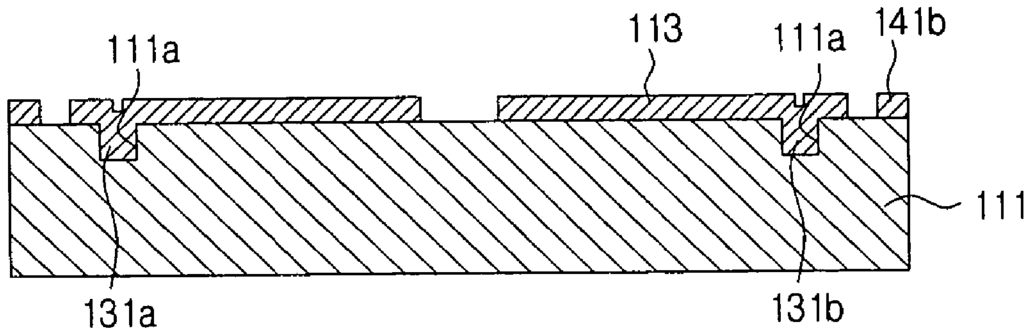
Figure 7A:
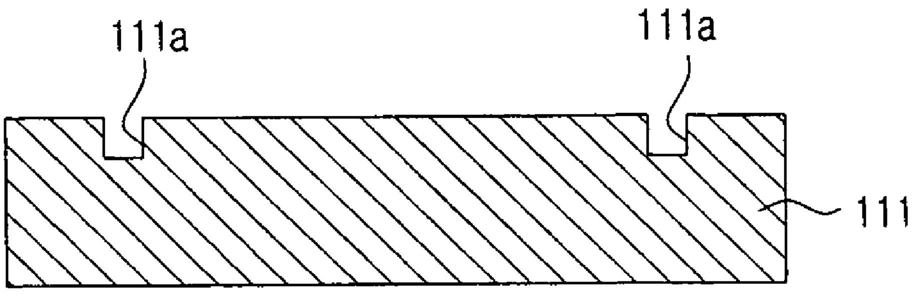
FIGS. 7A and 7B are sectional views illustrating process steps of forming the lower substrate shown in FIG. 2, where the views are taken along the line III-III' shown in FIG. 1.
Figure 7B:
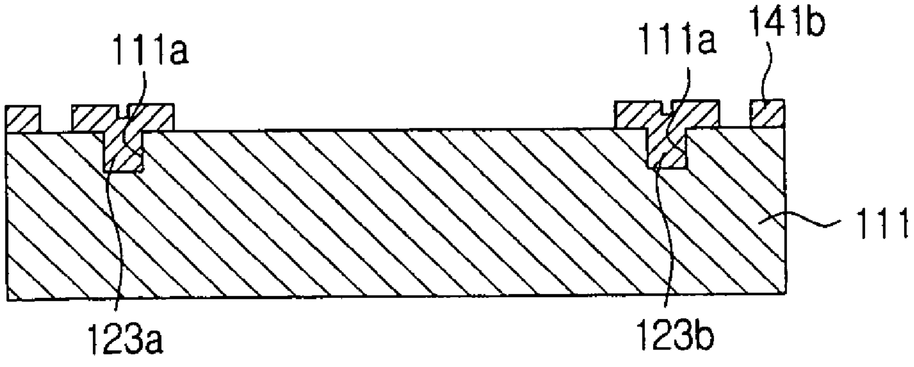

FIGS. 6A and 6B and FIGS. 7A and FIG. 7B illustrate the process steps of forming the structure of the lower substrate, and FIGS. 6A and 6B are views taken along the line II-II' and FIGS. 7A to 7B are views taken along the line III-III'.

Referring to FIG. 4, FIG. 6A, and FIG. 7A, a plurality of holes 111*a* is formed on the upper surface of the lower substrate 111.

Referring to FIG. 4, FIG. 6B, and FIG. 7B, for example, a conductive layer is formed on the upper surface of the lower substrate 111 and is made of An, AuSn, or PbSn. In this instance, the conductive layer is buried in the lower substrate 111 through the holes 111*a*, so that the voltage connection parts 123*a* and 123*b* and the signal line connection parts 131*a* and 131*b* are formed. Further, the conductive layer deposited is patterned by an etching process to form the signal line 113 and the lower voltage application pads 127*a* and 127*b*. Here, the lower sealing layer 141*b* can be formed on the edges of the lower substrate 111.

As such, after finishing processing of the lower substrate 111, the upper substrate 151 providing the switch driving part 150 is processed. The method for processing the upper substrate 151 will be described below.

FIGS. 8A to 8E are views illustrating sequential process steps of manufacturing the upper substrate shown in FIG. 2 and the views are taken along the line II-II' shown in FIG. 1.

Figure 8A:
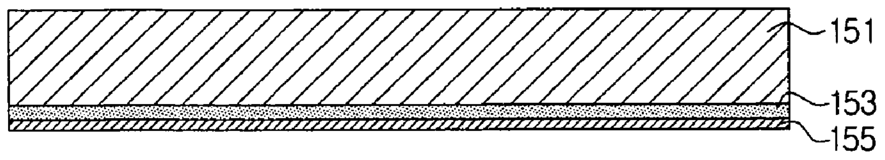
FIGS. 8A to 8E are sectional views illustrating process steps of forming the upper substrate shown in FIG. 2, where the views are taken along the line II-II' shown in FIG. 1.

Referring to FIG. 8A, for example, the membrane layer 153 and the heating layer 155 are sequentially deposited on a lower surface of the upper substrate 151, which may be, for example, a silicon substrate. Here, the membrane layer 153 may be formed, for example, of an oxide layer and the heating layer 155 may be formed, for example, of a polysilicon layer.

Figure 8B:
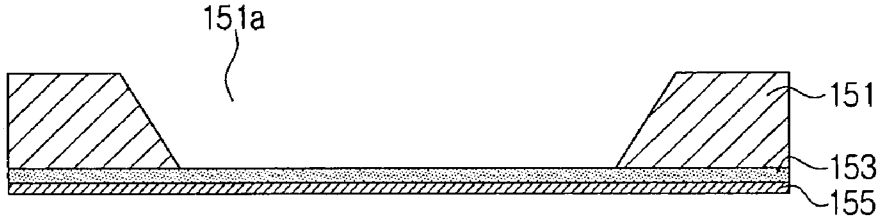

Referring to FIG. 8B, the cavity 151*a* is formed in the upper substrate 151.

Figure 8C:
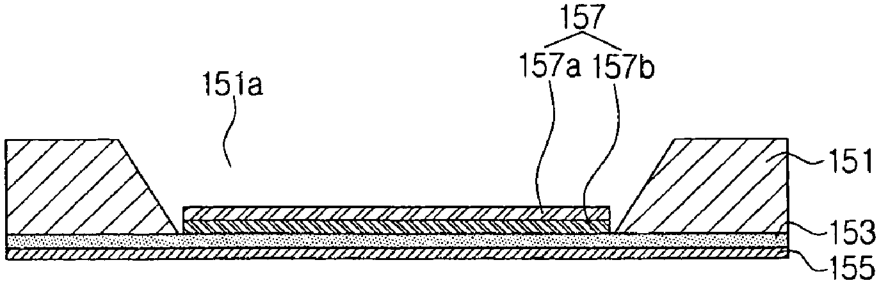

Referring to FIG. 8C, the bimetal layer 157 is formed in the cavity 151*a* on the membrane layer 153. The bimetal layer 157 is formed by sequentially depositing two different metal layers 157*a* and 157*b* having a different expansion rate, where the metal layer 157*a* preferably has a higher expandability than that of the metal layer 157*b*.

Figure 8D:
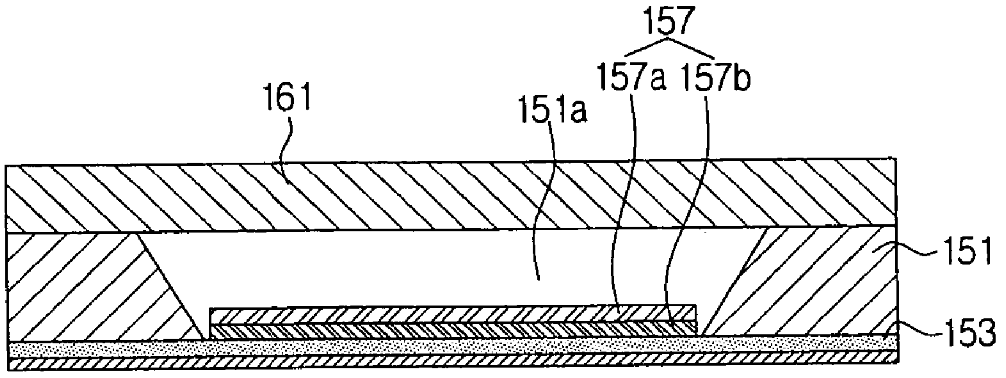

Referring to FIG. 8D, the cover 161, that may be made, for example, of a glass material, is bonded on the upper surface of the upper substrate 151. In this instance, the upper substrate 151 and the cover 161 can be joined by an anodic bonding method.

Figure 8E:
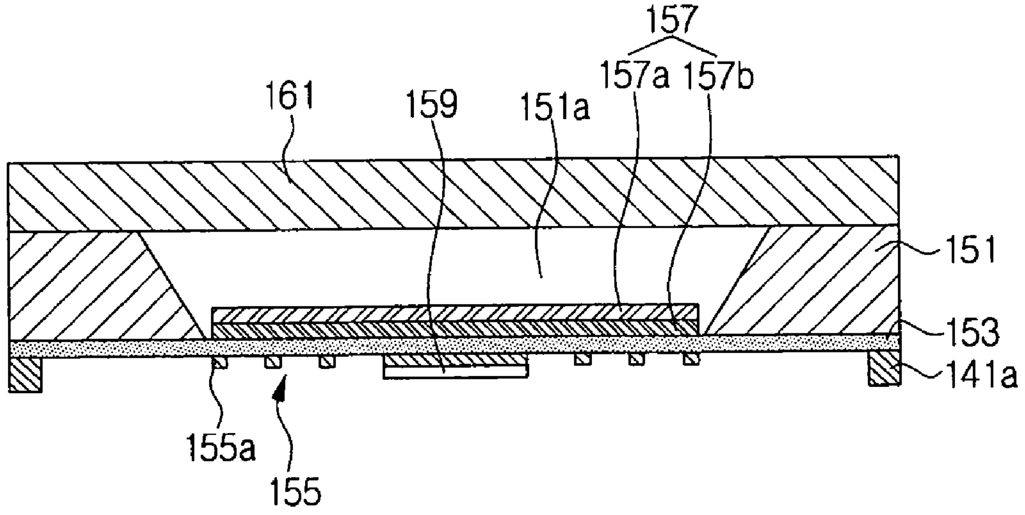

Referring to FIG. 8E, a conductive layer is deposited on the lower surface of the heating layer 155 and patterned to form the contact member 159. Further, the heating layer 155 is patterned in a helical shape to complete the electrical resistance heating body 155*a*. In this instance, the upper voltage application pads 121*a* and 121*b* for supplying a voltage to the electrical resistance heating body 155*a* are formed and the upper sealing layer 141*a* can be patterned along edges of the upper substrate 151.

Figure 9A:
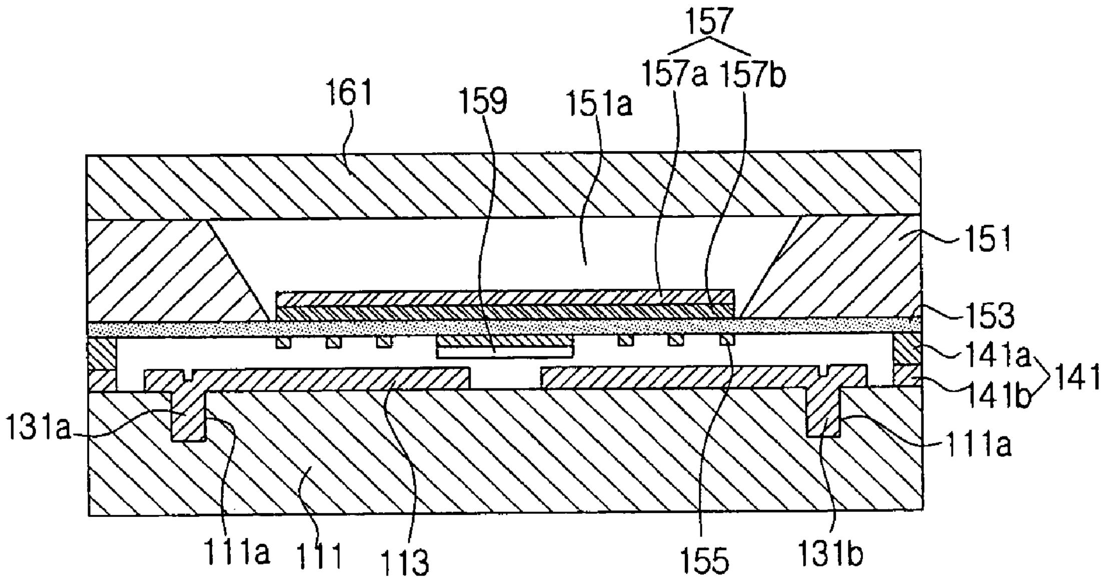
FIGS. 9A to 9C are sectional views illustrating the process steps of completing the MEMS switch by combining the upper substrate and the lower substrate, where the views are taken along the line II-II' shown in FIG. 1.
Figure 9B:
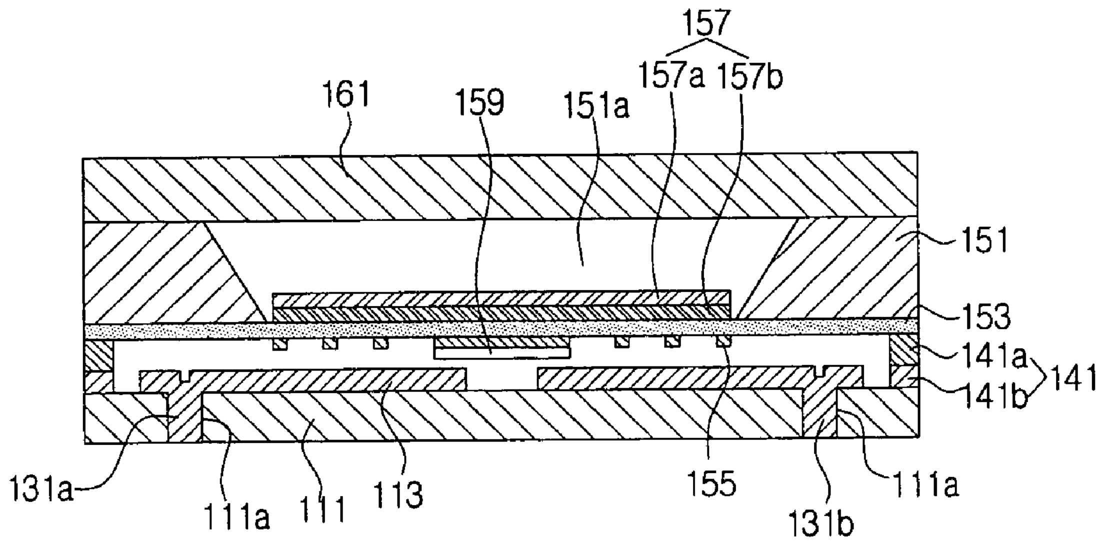
Figure 9C:
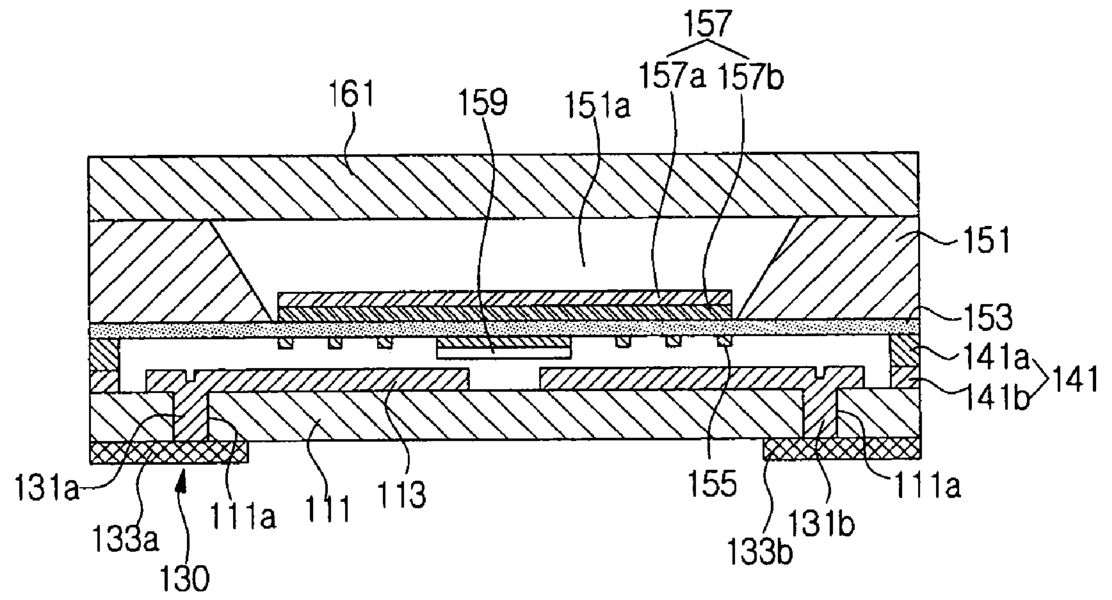

Referring to FIGS. 9A to 9C, the upper substrate and the lower substrate are combined together to complete the MEMS switch. FIGS. 9A to 9C are sectional views taken along the line II-II' shown in FIG. 1 and FIGS. 10A to 10C are sectional views taken along the line III-III' shown in FIG. 1.

Figure 10A:
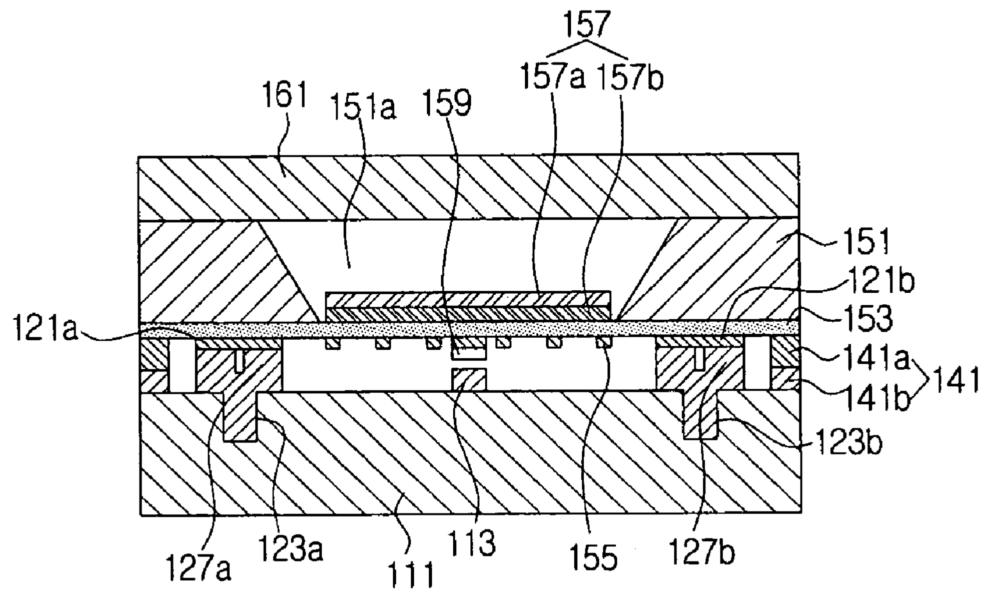
FIGS. 10A to 10C are sectional views illustrating the process steps of completing the MEMS switch by combining the upper substrate and the lower substrate, where the views are taken along the line III-III' shown in FIG. 1.

Referring to FIG. 9A and FIG. 10A, the upper substrate 151 and the lower substrate 111 are bonded using the upper and lower sealing layers 141*a* and 141*b*. Here, the bondable conductive material may include, for example, Au, AuSn, or PbSn.

Figure 10B:
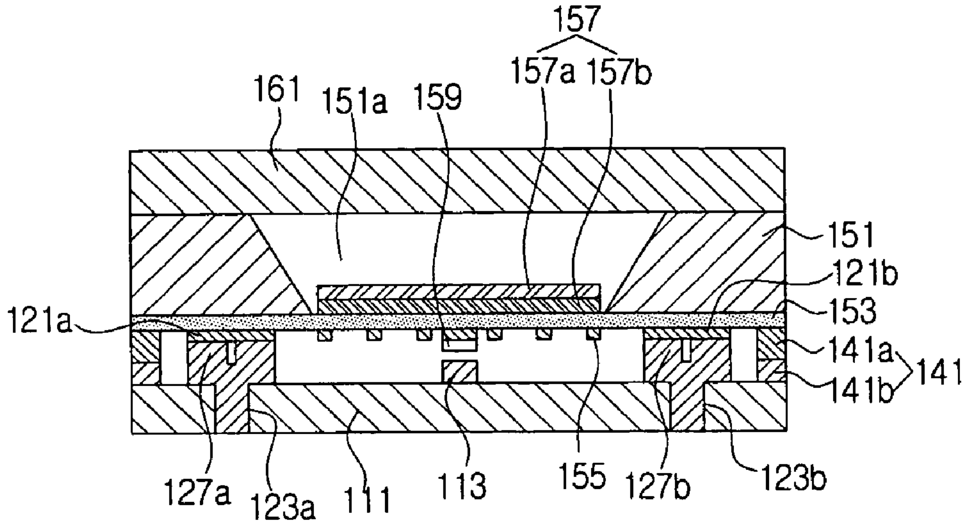

Referring to FIG. 9B and FIG. 10B, the lower surface of the lower substrate 111 is subject to a polishing process to expose the voltage connection parts 123*a* and 123*b* and the signal line connection parts 131*a* and 131*b* buried in the holes 111*a*.

Figure 10C:
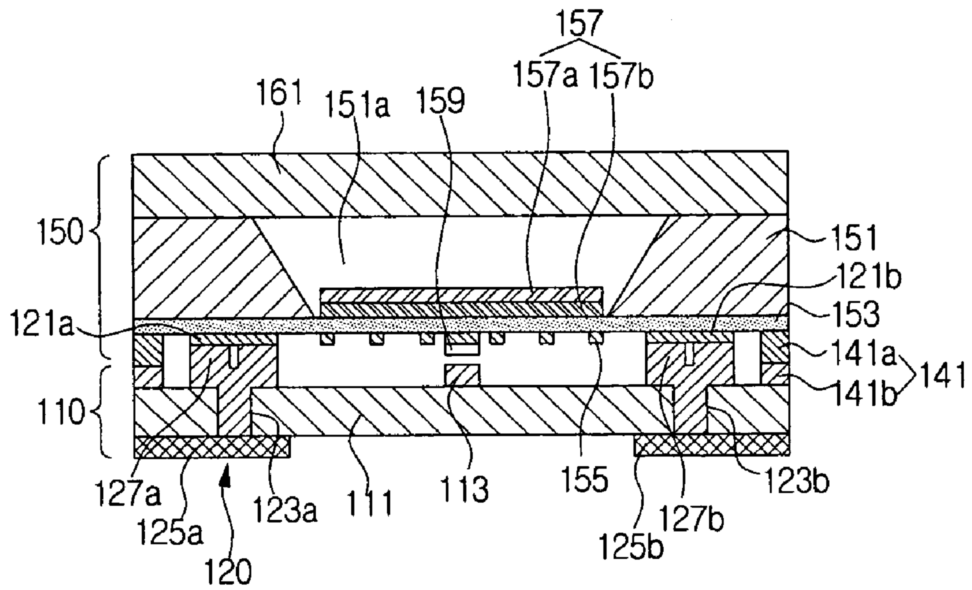

Referring to FIG. 9C and FIG. 10C, a conductive layer is deposited on the lower surface of the lower substrate 111 and patterned to form the external voltage application pads 125*a* and 125*b* and the signal line pads 133*a* and 133*b* to be connected to the voltage connection parts 123*a* and 123*b* and the signal line connection parts 131*a* and 131*b*.

As described above, the MEMS switch according to the present invention has at least the following advantages.

First, the MEMS switch according to the present invention operates at a lower driving voltage compared to conventional MEMS switches.

Second, since an additional packaging process is not needed, a yield of producing the MEMS switches is enhanced.

Third, since the contact member comes into contact with the signal line by the bimetal switching operation, a contact force is enhanced compared to the conventional switches.

While the invention has been shown and described with reference to certain embodiments thereof, it will be understood by those skilled in the art that various changes in form and details may be made therein without departing from the spirit and scope of the invention as defined by the appended claims.

What is claimed is:

1. A Micro-Electro-Mechanical Systems (MEMS) switch, comprising:

a lower substrate having a signal line on an upper surface of the lower substrate;

an upper substrate, having a cavity therein, disposed apart from the upper surface of the lower substrate by a distance, and having a membrane layer on a lower surface of the upper substrate;

a bimetal layer formed in the cavity of the upper substrate on the membrane layer;

a heating layer formed on a lower surface of the membrane layer; and a contact member formed on a lower surface of the heating layer;

wherein the contact member can come into contact with or separate from the signal line.

2. The MEMS switch according to claim 1, further comprising:

a sealing layer disposed between the upper and lower substrates for maintaining the distance between the upper and lower substrates and for sealing an inner space between the upper and lower substrates.

3. The MEMS switch according to claim 1, further comprising:

a cover disposed over the upper substrate for covering the cavity.

4. The MEMS switch according to claim 1, wherein the membrane layer is made of an oxide material.

5. The MEMS switch according to claim 1, wherein the heating layer is made of a polysilicon material.

6. The MEMS switch according to claim 1, wherein the heating layer comprises an electrical resistance heating body.

7. The MEMS switch according to claim 6, wherein the electrical resistance heating body has a helical shape.

8. The MEMS switch according to claim 6, wherein the electrical resistance heating body comprises:

a power supply unit for supplying a voltage.

9. The MEMS switch according to claim 8, wherein the power supply unit comprises:

an upper voltage application pad connected to the electrical resistance heating body;

a lower voltage application pad formed on the upper surface of the lower substrate and connected to the upper voltage application pad;

a voltage connection part buried in the lower substrate through a hole and connected to the lower voltage application pad; and an external voltage application pad formed on a lower surface of the lower substrate and connected to an external voltage application pad connected to the voltage connection part.

10. The MEMS switch according to claim 1, further comprising:

a signal line connection unit for connecting the signal line on the lower substrate to an external circuit.

11. The MEMS switch according to claim 10, wherein the signal line connection unit comprises:

a signal line connection part buried in the lower substrate through a hole and connected to the signal line; and a signal line pad formed on a lower surface of the lower substrate and connected to the signal line connection part.

12. The MEMS switch according to claim 1, wherein the upper and lower substrates are made of a silicon material and the cover is made of a glass material.

13. The MEMS switch according to claim 1, wherein the signal line, contact member, and sealing layer are made of a bondable conductive material, and wherein the conductive material is one of Au, AuSn, and PbSn.

* * * * *